(12) United States Patent
Buis et al.

(10) Patent No.: US 7,629,593 B2
(45) Date of Patent: Dec. 8, 2009

(54) LITHOGRAPHIC APPARATUS, RADIATION SYSTEM, DEVICE MANUFACTURING METHOD, AND RADIATION GENERATING METHOD

(75) Inventors: Edwin Johan Buis, Belfeld (NL); Vadim Yevgenyevich Banine, Helmond (NL); Tjarko Adriaan Rudolf Van Empel, Eindhoven (NL); Maarten Marinus Johannes Wilhelmus Van Herpen, Heesch (NL); Wouter Anthon Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 231 days.

(21) Appl. No.: 11/819,707

(22) Filed: Jun. 28, 2007

(65) Prior Publication Data

US 2009/0001288 A1 Jan. 1, 2009

(51) Int. Cl.
*G21K 5/04* (2006.01)

(52) U.S. Cl. ............. 250/492.1; 250/492.2; 250/504 R; 250/492.22; 250/493.1; 355/30

(58) Field of Classification Search ............ 250/492.1, 250/492.2, 492.21, 492.22, 492.3, 493.1, 250/504 R, 492.23, 505.1; 165/80.4; 355/30, 355/34, 53, 71; 378/34, 119
See application file for complete search history.

(56) References Cited

U.S. PATENT DOCUMENTS

2002/0070353 A1* 6/2002 Richardson .............. 250/492.1
2004/0169151 A1* 9/2004 Yagi et al. ................ 250/492.2
2005/0236584 A1* 10/2005 Tsuji ....................... 250/492.1
2006/0006350 A1* 1/2006 Schuurmans et al. .... 250/504 R
2006/0133577 A1* 6/2006 Saint-Martin et al. ....... 378/130
2007/0115443 A1* 5/2007 Box et al. ..................... 355/30
2007/0146659 A1* 6/2007 Klunder et al. ............... 355/30
2007/0284541 A1* 12/2007 Vane ..................... 250/441.11
2008/0142736 A1* 6/2008 Wassink et al. .......... 250/492.1

FOREIGN PATENT DOCUMENTS

EP 1434098 A2 * 6/2004

* cited by examiner

*Primary Examiner*—Jack I Berman
*Assistant Examiner*—Nicole Ippolito Rausch
(74) *Attorney, Agent, or Firm*—Pillsbury Winthrop Shaw Pittman LLP

(57) ABSTRACT

A lithographic apparatus includes a radiation system constructed to provide a beam of radiation from radiation emitted by a radiation source. The radiation system includes a contaminant trap configured to trap material emanating from the radiation source. The contaminant trap includes a contaminant engaging surface arranged in the path of the radiation beam that receives the material emanating from the radiation source during propagation of the radiation beam in the radiation system. The radiation system also includes a liquid tin cooling system constructed to cooling the contaminant trap with liquid tin. The apparatus includes an illumination system configured to condition the radiation beam, a support constructed to support a patterning device configured to impart the radiation beam with a pattern in its cross-section, a substrate table constructed to hold a substrate, and a projection system configured to project the patterned radiation beam onto a target portion of the substrate.

28 Claims, 10 Drawing Sheets

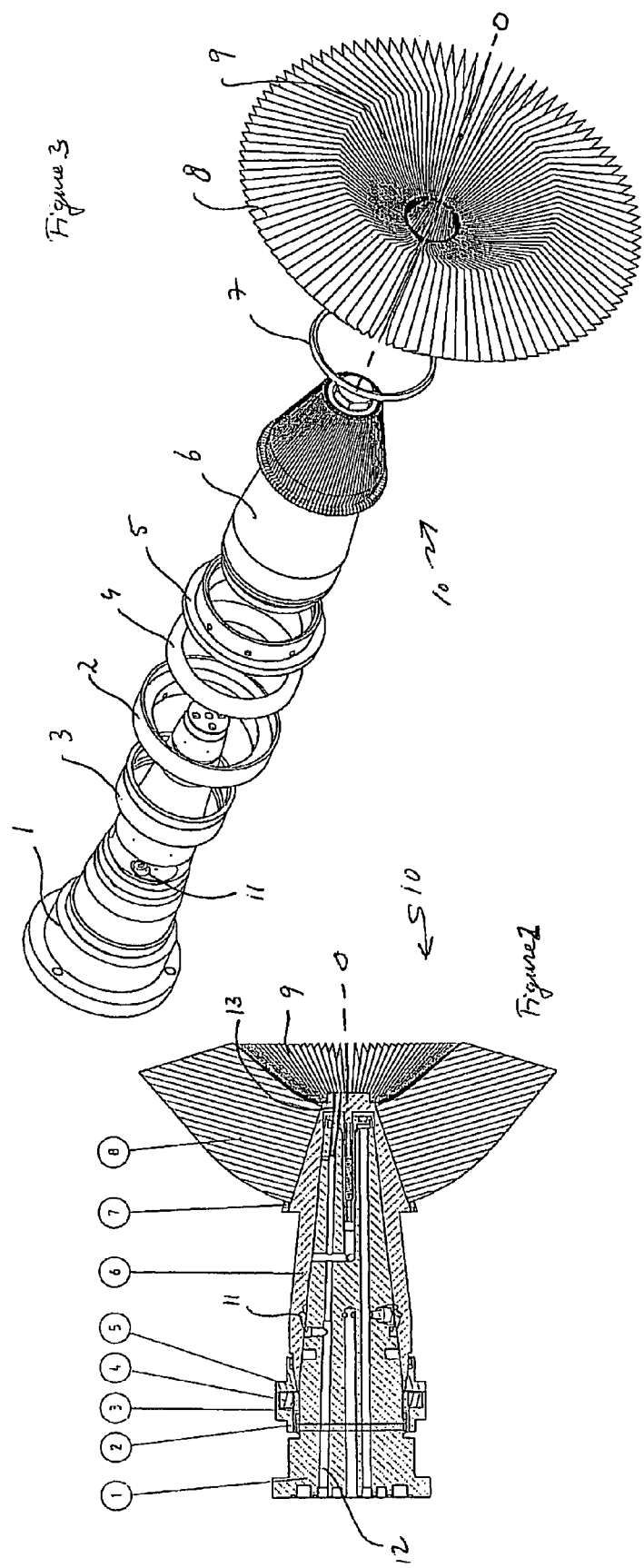

LITHOGRAPHIC APPARATUS, RADIATION SYSTEM, DEVICE MANUFACTURING METHOD, AND RADIATION GENERATING METHOD

FIELD

The present invention relates to a lithographic apparatus, a radiation system, a device manufacturing method, and a radiation generating method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To image smaller features, it has been proposed to use extreme ultraviolet radiation (EUV) with a wavelength in the range of 5-20 nanometers, in particular, 13.5 nanometers, or a charged particle beam, e.g. an ion beam and an electron beam, as the exposure radiation in a lithographic apparatus. These types of radiation need the beam path in the apparatus to be evacuated to avoid absorption. Since there are no known materials suitable to make a refractive optical element for EUV radiation, EUV lithographic apparatus use mirrors in the radiation, illumination and projection systems. Such mirrors are highly susceptible to contamination, thereby reducing their reflectivity and hence the throughput of the apparatus. Further, sources for EUV may produce debris whose entry into the illumination system should be minimized.

In order to reduce the chance of debris entering the illumination system, contaminant traps may be used. Such traps are disposed in the radiation system downstream of the source. The traps comprise elements that provide a surface on which debris can deposit. Conventional radiation systems may also comprise a collector which collects the radiation beam. It has been found that debris may also deposit on elements in the collector. The deposit of debris on the collector significantly reduces its operational lifetime before it must be cleaned.

It has been found that as the temperature of elements in the contaminant trap increases, the greater the contamination, and hence, the shorter the lifetime of the collector. This is because it has been found that at higher temperatures, the elements of the contaminant trap may become secondary sources of contamination. In particular, certain debris on the elements may be vaporized. The vaporized debris then goes on to further contaminate the collector. Further, in applying more powerful EUV sources causing increasing heat loads, contaminant trap elements may melt and/or vaporize, which may cause a collapse of the entire debris barrier.

SUMMARY

It is desirable to counteract the effects of a high temperature realized by the contaminant trap.

According to an aspect, there is provided a lithographic apparatus comprising a radiation system constructed to provide a beam of radiation from radiation emitted by a radiation source. The radiation system comprises a contaminant trap configured to trap material emanating from the radiation source. The contaminant trap comprises a contaminant engaging surface arranged in the path of the radiation beam that receives the material emanating from the radiation source during propagation of the radiation beam in the radiation system, and a liquid tin cooling system constructed to cool the contaminant trap with liquid tin. The apparatus also comprises an illumination system configured to condition the radiation beam, a support constructed to support a patterning device, the patterning device being configured to impart the radiation beam with a pattern in its cross-section to form a patterned radiation beam, a substrate table constructed to hold a substrate, and a projection system configured to project the patterned radiation beam onto a target portion of the substrate.

According to an aspect, there is provided a radiation system constructed to provide a beam of radiation from radiation emitted by a radiation source. The radiation system comprises a contaminant trap configured to trap material emanating from the radiation source. The contaminant trap comprises a contaminant engaging surface arranged in the path of the radiation beam that receives the material emanating from the radiation source during propagation of the radiation beam in the radiation system. The radiation system further comprises a liquid tin cooling system constructed to cooling the contaminant trap with liquid tin.

According to an aspect, there is provided a device manufacturing method trapping material emanating from a radiation source using a contaminant trap comprising a contaminant engaging surface arranging the surface in a radiation beam emitted by the radiation source, cooling the contaminant trap with liquid tin, conditioning the radiation beam, imparting the radiation beam with a pattern in its cross-section using a patterning device to form a patterned radiation beam, and projecting the patterned radiation beam onto a target portion of a substrate.

According to an aspect, there is provided a radiation generating method comprising trapping material emanating from a radiation source using a contaminant trap comprising a contaminant engaging surface by arranging the surface in a radiation beam emitted by the radiation source, and cooling the contaminant trap with liquid tin.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a schematic cross sectional view of a contaminant trap comprised in a radiation system according to an embodiment of the invention;

FIG. 3 depicts a schematic perspective view of the contaminant trap comprised in a radiation system of FIG. 2;

DETAILED DESCRIPTION

Figure 1:
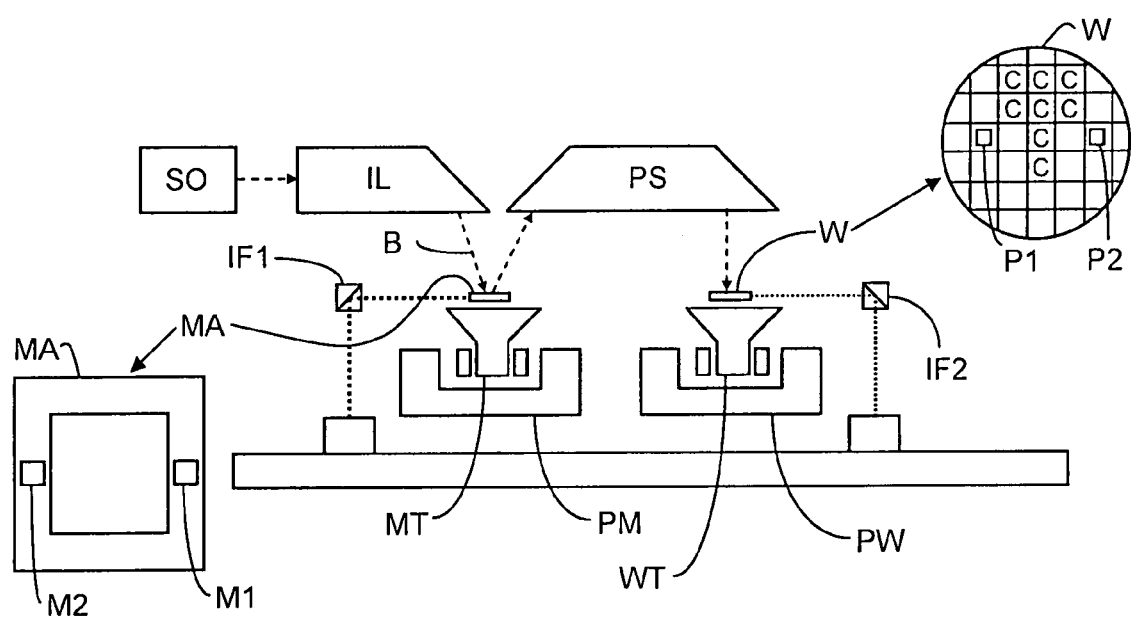
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or visible light radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, configured to direct, shape, or control radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser.

The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 and depict a schematic cross sectional view and a schematic perspective view, respectively, of a contaminant trap 10 comprised in a radiation system according to an embodiment. The radiation system is constructed to provide a beam of radiation from radiation emitted by a radiation source SO (shown in FIG. 1). The radiation source SO can be formed by a discharge plasma. The radiation source SO can be of the EUV type and may be a tin (Sn) based plasma source. Alternatively, the EUV type radiation source SO might use a gas or vapour, such as Xe gas or Li vapor. The contaminant trap 10, which may be considered to be a rotating foil trap, may comprise a rotatable contaminant trap element 8 configured to trap material emanating from the radiation source SO. Thereto, the rotatable contaminant trap element 8 comprises multiple elements arranged in the path of the radiation beam on which the material emanating from the radiation source can deposit during propagation in the radiation system. In the contaminant trap 10 shown in FIGS. 2 and 3, the multiple elements arranged in the path of the radiation beam comprise metal platelets 9, also called foils. The foils or platelets 9 comprise debris or contaminant receiving surfaces that are arranged in the path of the radiation beam to prevent debris, i.e. contaminant material, including particles, thrust by the source from reaching optical components of the radiation system, e.g. a collector and the illuminator IL. The foils are arranged radially around a longitudinal axis O of the contaminant trap 10.

The contaminant trap 10 comprises a static part 1, and a plurality of ring-shaped elements 2, 3, 4 and 5 arranged around the static part 1 that support and guide a rotating part 6 on which the rotatable contaminant trap element 8 with the foils 9 is built. The foils 9 form strips that are preferably manufactured from metal, e.g. molybdene. The foils 9 are sealingly connected to the rotating part 6 via a ring-shaped seal 7. The rotating part 6 is driven by a gas flow flowing from flow openings 11 in the exterior of the static part 1. The gas also serves as a bearing between the static part 1 and the rotating part 6. Further, the contaminant trap 10 comprises a channel structure 12, as will be explained in further detail below.

The contaminant trap 10 further comprises a liquid tin cooling system constructed to cool the contaminant trap 10, and especially the rotatable contaminant trap element 8, with liquid tin. By cooling the contaminant trap 10 with liquid tin, a contaminant trap 10 is obtained wherein the occurrence of a high temperature may be counteracted. The liquid tin cooling may be considerably more effective than heat transfer via radiation. It is noted that heat conduction via gas particles in the radiation system is relatively poor, due to the vacuum that is applied during operation. Also, conduction via the material of the rotatable contaminant trap element 8 is relatively small since the foils 9 are very thin and material contact to the static part 1 is relatively small as the rotating part 6 is supported via bearings. As a result, liquid tin cooling may significantly improve the transfer of heat. Consequently, the occurrence of high temperatures, e.g. up to and even above 650° C., may be reduced. Since such high temperatures may be avoided, undesired melting processes of elements in the radiation system may also be avoided. Further, by cooling with liquid tin, radiation sources having a relatively large power can be applied, e.g. up to circa 100 kW. By using a liquid tin cooling system, also the frequency of the radiation source and the running time of the apparatus can be relatively high. It is further noted that the application of a liquid tin cooling system in combination with a tin based plasma radiation source leads to the further advantage that no contamination will occur. In addition, no specific redesign regarding material protection is needed since the used materials are already liquid tin compatible due to the applied radiation source. Also, in case of a system malfunctioning or a breakdown, the occurrence of contamination is practically negligible. As a further advantage, a liquid tin cooling system can be applied with significant overpressure, which enables thin channels in the contamination trap 8 without significantly disturbing rotating forces and/or deforming mechanical parts of the trap 8.

The cooling liquid tin can be collected for re-use, thereby providing an efficient cooling system. The cooling liquid can e.g. be collected at a bottom of a chamber in which the contaminant trap is arranged. Thus, both the cooling liquid and captured Sn debris emanating from the radiation source can be collected for re-use purposes in the cooling system.

By arranging the liquid tin cooling system constructed to condition the temperature of the contaminant trap 10, a solidification process of tin particles may be counteracted. Solid tin particles may induce unbalance of the rotating foils 9, and may cause radiation transmission loss and even failure. Thus, the operation of the source can be stopped without undesired solidification process. As an example, the temperature of the supplied liquid tin can be maintained at a temperature of approximately 250° C. sufficiently high above the melting point of tin. By maintaining the temperature of the supplied liquid tin at a pre-determined degree, the temperature of the contaminant trap 10 may be conditioned, thereby providing a cooling effect when the temperature of the trap 10 tends to increase, and providing a heating effect when the temperature of the trap 10 tends to decrease below the pre-determined liquid tin supply temperature.

The radiation system shown in FIGS. 2 and 3 comprises a liquid tin cooling system wherein a closed liquid tin circuit 12 has been arranged inside the static part 1 of the contaminant trap 10. During operation, the closed liquid tin circuit 12 actively cools the static part 1 of the contaminant trap 10. The liquid tin cooling system may comprise a semi-open liquid tin circuit constructed to directly cool a rotating part of the contaminant trap. The circuit than comprises open channel sections at the exterior surface of the trap 8. The liquid tin cooling system may optionally comprise a liquid tin supply channel 13 inside the static part of the contaminant trap, the supply channel 13 extending to a rotating part of the contaminant trap for supplying the liquid tin towards an external surface of said rotating part. The liquid tin cooling system may further comprise a return path along a leading edge of a foil 9 of the contaminant trap 10. The liquid tin may create a capillary flow along the leading edge of the foil, thereby transferring the heat from a segment where the heat load on the foil is relatively high. The return path may be embedded in a foil 9 of the contaminant trap 10, e.g. via a semi open circuit or via interior channels. Due to the geometry and centrifugal flow, the liquid tin will flow radially outwardly and drop towards a bottom of the chamber wherein the trap 10 is arranged.

Figure 4:
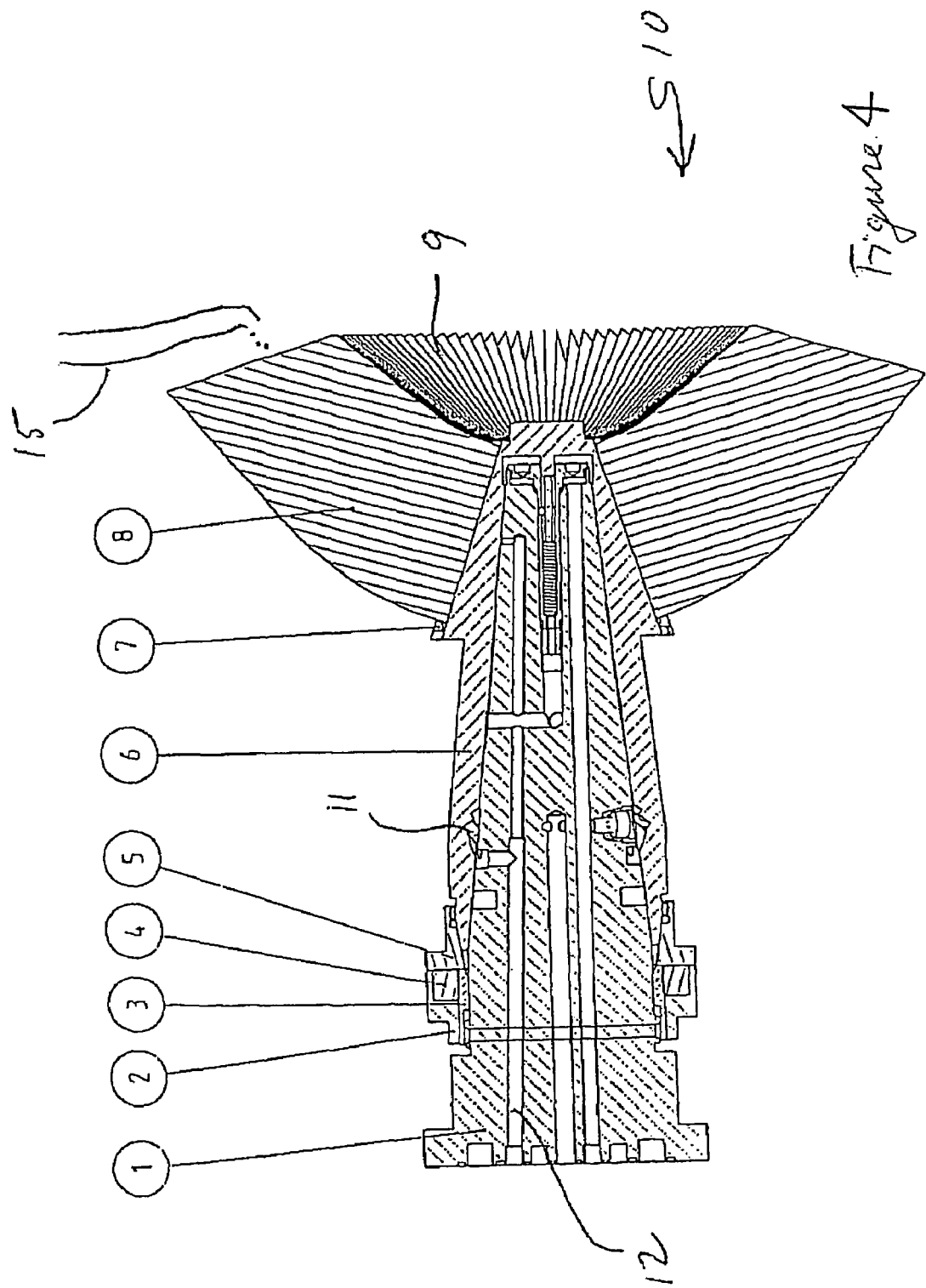
FIG. 4 depicts a schematic cross sectional view of a contaminant trap comprised in a radiation system according to an embodiment of the invention.
Figure 5:
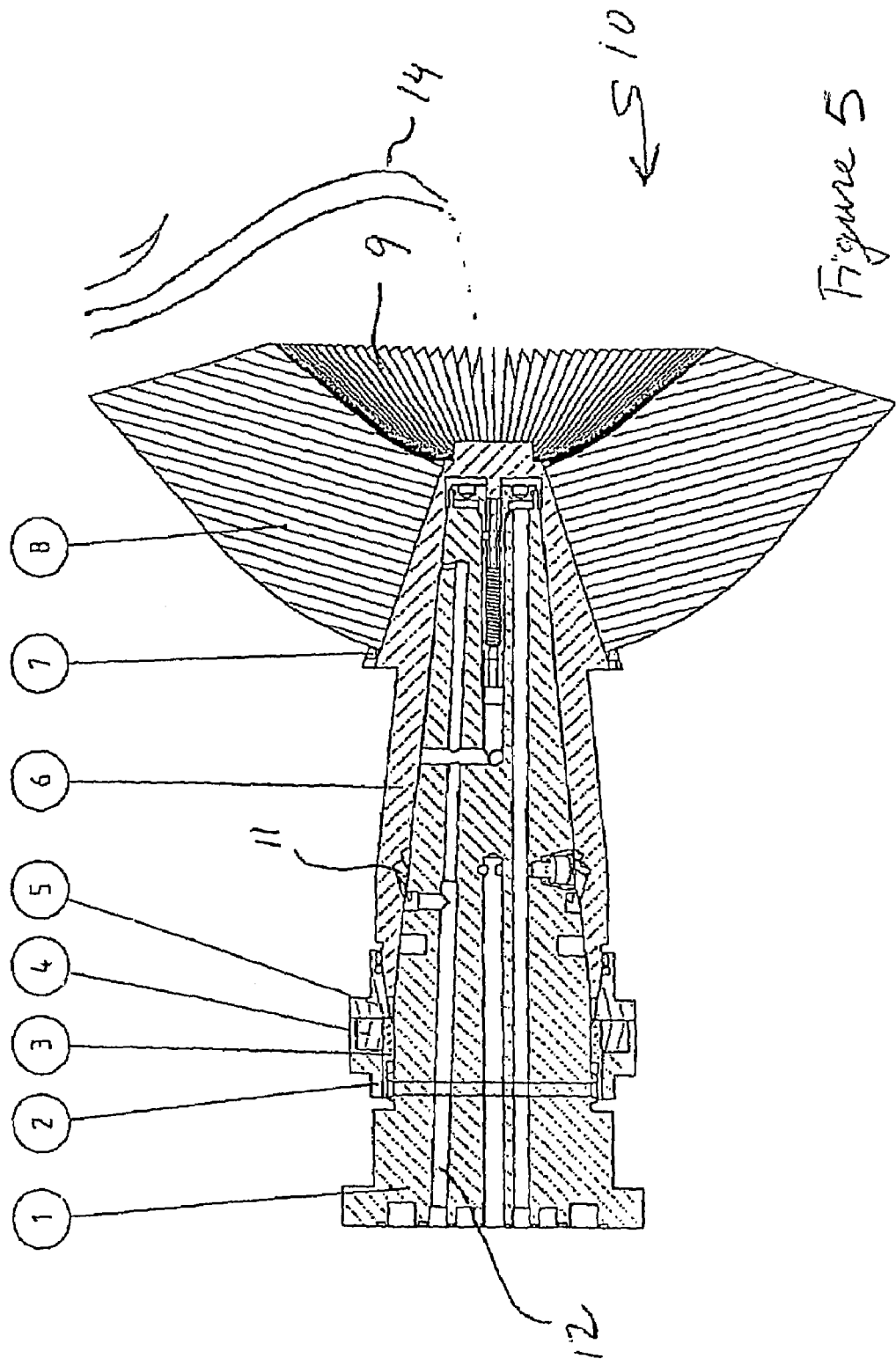
FIG. 5 depicts a schematic cross sectional view of a contaminant trap comprised in a radiation system according to an embodiment of the invention.

FIGS. 4 and 5 depict schematic cross sectional views of a contaminant trap comprised in a radiation system according to embodiments of the invention. In FIG. 4, the liquid tin cooling system comprises, apart from the closed liquid tin circuit 12 described above, an exterior supply channel 15 having a spray end arranged to spray the rotating part of the contaminant trap 10. In FIG. 5, an exterior supply channel 14 has a spray end that is arranged near a foil 9 of the contaminant trap 10. Initially, the cooling liquid tin covers a leading edge of the foil 9 and than flows over the blades and drops to the bottom of said chamber. It is further noted that the exterior supply channel 15 is inherently cooled by the cooling liquid tin flowing through it.

The embodiments described above may provide a reliable tin removal and effective cooling of the contaminant trap.

In an embodiment, liquid tin regeneration processes, like filtering and/or chemical cleaning may be performed in the circuit 12 or a supply channel.

Further, the radiation system might comprise an external heating system, such as an electrical heating system constructed to enable the system to start up from a situation in which the tin has been solidified, e.g. from a maintenance status.

Figure 6:
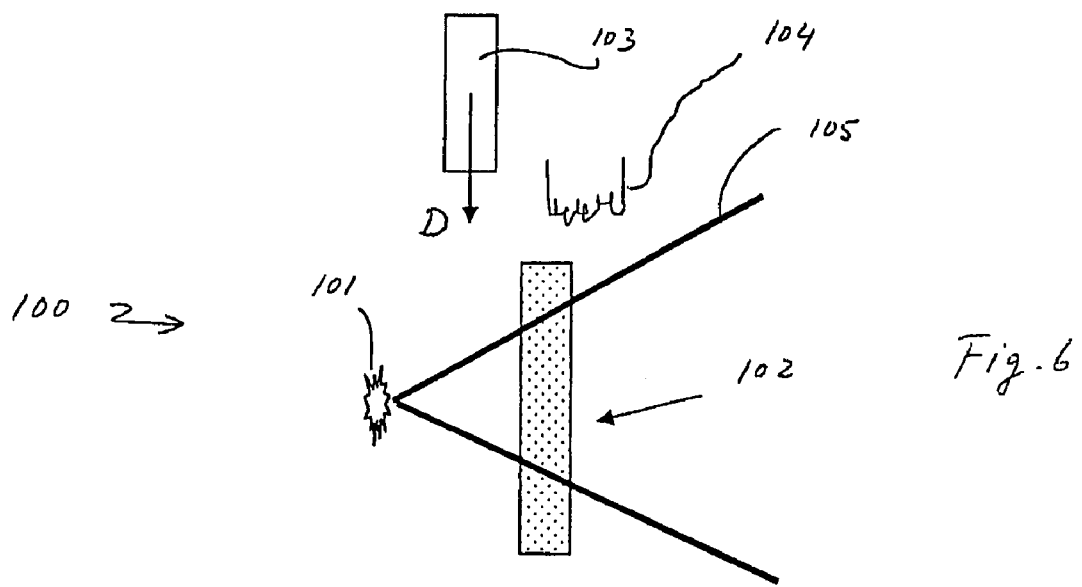
FIG. 6 depicts a schematic cross sectional view of a radiation system according to an embodiment of the invention.

In order to further improve cooling effects of the liquid tin system and/or radiation transmission characteristics of the contaminant trap, a contaminant trap exterior surface can be pre-treated to improve surface wetting characteristics. In an embodiment of a radiation system 100, as shown in FIG. 6, the pre-treating step comprises heating said surface. The heating step is performed by arranging a heating element 104 near the contamination trap 102. The trap 102 is arranged in the path of the radiation beam 105 on which the material emanating from the radiation source 101 can deposit during propagation of the radiation beam 105 in the radiation system 100. By activating the heating element 104, the contaminant trap exterior surface is heated, thereby removing contamination and oxides from its surface. As a consequence, Sn wetting characteristics of the surface and thereby also cooling effects are enhanced, since liquid tin will form a substantially thin coating over the surface. Moreover, the occurrence of small tin droplets is counteracted, thereby also improving a radiation transmission of the contamination trap. The apparatus may further comprise a gas inlet 103 arranged near the contamination trap 102. By flowing hydrogen gas in a direction D into a chamber in which the contamination trap 102 is arranged, the removal of contamination and oxides from the exterior surface may be improved. The hydrogen gas may be introduced in the chamber before the heating element 104 is activated. In addition to, or in place of applying a separate heating element 104, the radiation source 101 can be activated at a reduced level to act as a heat source. After the pre-treating step, the system can be operated using the liquid tin cooling system.

Figure 7:
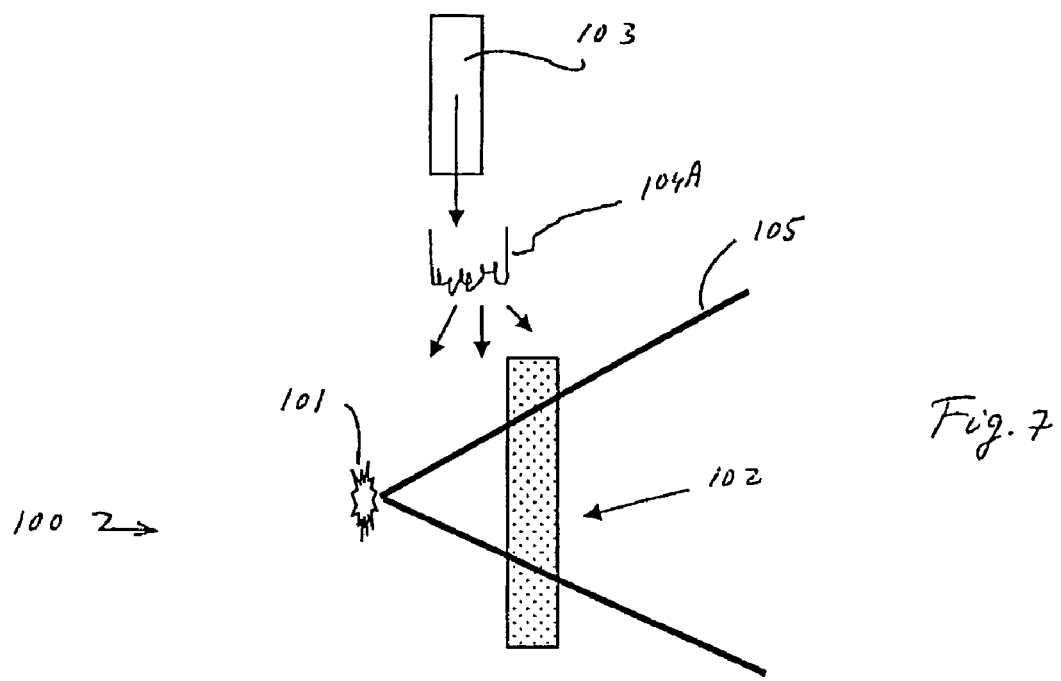
FIG. 7 depicts a schematic cross sectional view of a radiation system according to an embodiment of the invention.

In an embodiment of the radiation system, shown in FIG. 7, the system comprises a radical generating unit or a plasma generating unit 104A that generates hydrogen radicals or a hydrogen plasma, respectively. By activating a radical generating unit, hydrogen molecules that are introduced in the chamber are at least partially transformed into radicals, thereby facilitating the removal of oxides and contaminants in a faster way and/or at a lower temperature. The radical generating unit 104A can be implemented as a hot filament or as a radio frequency discharge element. By employing a plasma generating unit 104A, contaminations on the exterior trap surface can be removed. The surface may be treated by an oxygen plasma.

Figure 8:
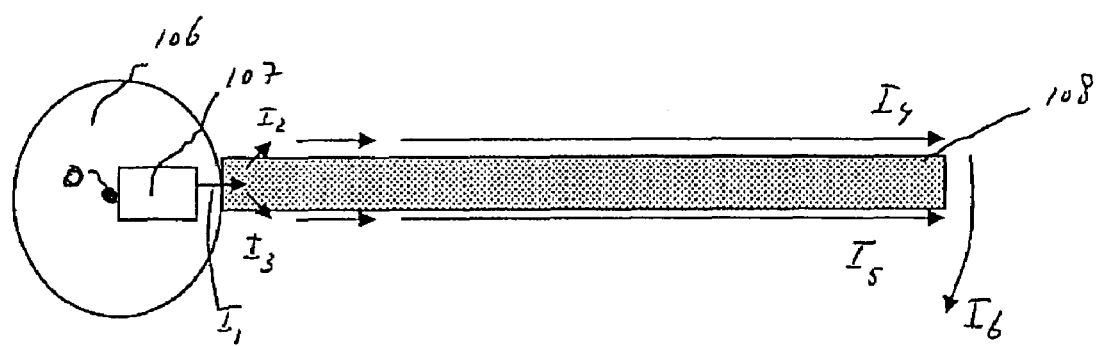
FIG. 8 depicts a schematic cross sectional view of a section of a radiation system according to an embodiment of the invention.

FIG. 8 depicts a schematic cross sectional view of a section of a radiation system according to an embodiment. In particular, FIG. 8 shows a central part 106, which may also be called a plug, of the contaminant trap 8 that is centered with respect to the longitudinal axis O of the trap. A foil 108 is connected to the central part 106. The foil 108 may be formed by a material that is substantially porous. As shown, a liquid tin supply channel 107 ends in the porous structure of the foil 108. During operation, the liquid tin flows via the supply channel 107 into the porous structure, via a path $I_1$, and than via further paths $I_2$, $I_3$, towards the exterior surface of the foil 108. Due to centrifugal forces of the rotating foil 108 with respect to the axis O, the liquid tin flows along the surface via paths $I_4$, $I_5$ towards the radial end of the foil 108, thereby uniformly covering the exterior surface of the foil 108. From the end of the foil 108, the liquid tin drops from the foil 108 via path $I_6$ towards a bottom structure of the chamber, where the Sn can be collected and possibly recycled. By injecting the liquid tin in a porous structure of the foil 108, a substantially uniform injection process is obtained, which may provide a relatively smooth liquid tin layer at the foil surface, which may enhance cooling properties. In an embodiment, at least a segment of the foil is substantially porous. The porous segment of the foil may be located near an end of the liquid tin supply channel 107 and/or near the exterior surface of the foil 108.

According to a further aspect, an exterior surface of the contaminant trap, such as an exterior surface of a foil, comprises a top layer having a low oxidation rate, such as gold. By providing a top layer having a relatively low oxidation rate, contaminations and oxides on the exterior surface may be counteracted. As an example, the foil might be formed by a molybdenum kernel covered with a thin gold coating. Optionally, the exterior surface has a low solubility in liquid tin, preferably having a solubility less than about 0.05%, more preferably less than about 0.005%. Thus, the foil is not solved during liquid tin cooling processes. Liquid metals other than Sn may be used. In an embodiment, a Ga—In—Sn, Ga—Sn, or In—Sn alloy may be used. Such alloys are liquid at a lower temperature than Sn, which may increase the cooling rate, reduce a minimum system temperature, and relax the heating specifications.

Figure 9:
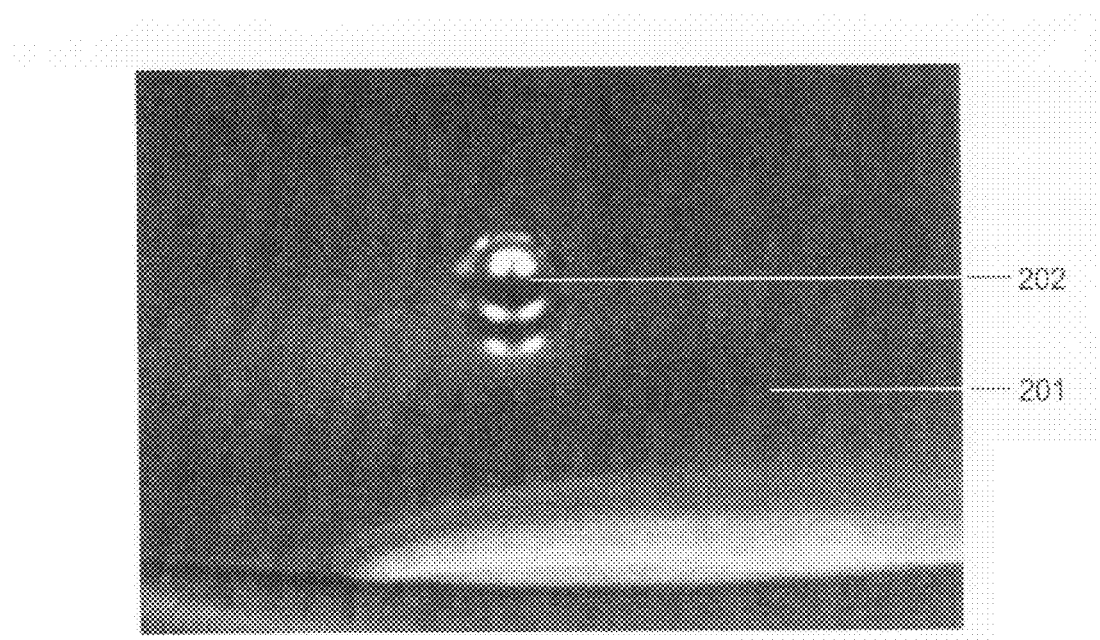
FIG. 9 depicts a view of a droplet on a platelet.
Figure 10:
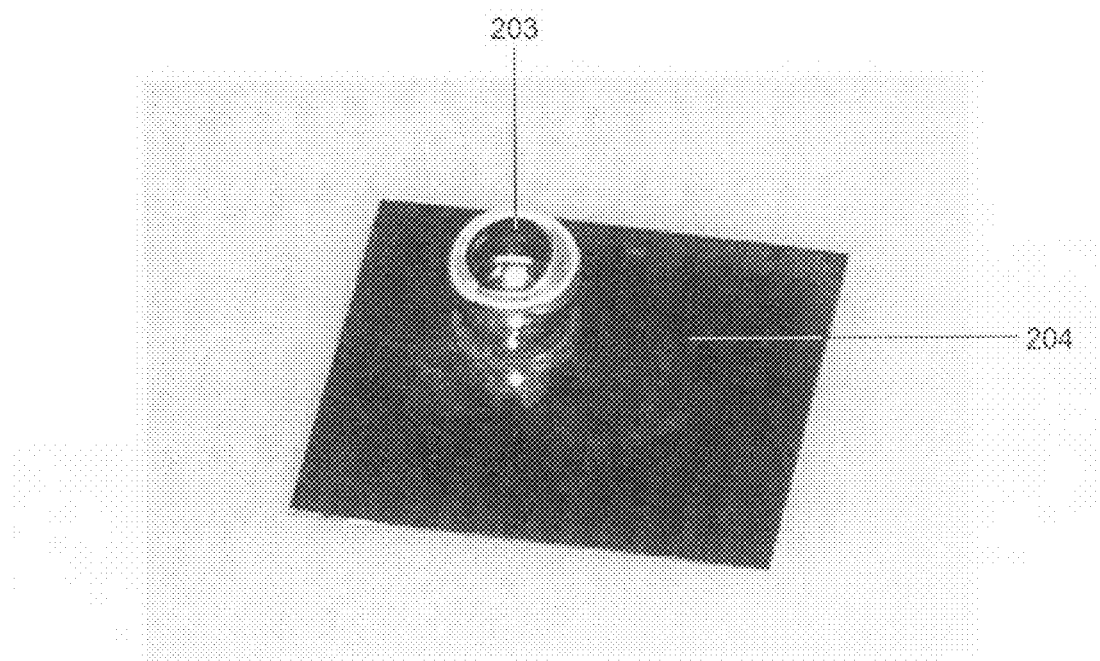
FIG. 10 depicts a view of a droplet on a platelet.

FIGS. 9-14 show experimental results of droplets wetting exterior surfaces of metal plates. In particular, experiments have been performed simulating the wetting behavior of tin. A Ga—In—Sn alloy approaches the wetting behavior of tin. Since the Ga—In—Sn alloy is a liquid at room temperature, the alloy is used for the experiments. The experiments are performed in an argon atmosphere to prevent the Ga component in the alloy to oxidize. FIG. 9 shows a droplet 202 of Ga—In—Sn alloy on a molybdenum (Mo) platelet 201. Similarly, FIG. 10 shows a droplet 203 of Ga—In—Sn alloy on a Mo platelet on which a Ga2O3 coating 204 has been deposited. Both FIGS. 9 and 10 show that hardly any wetting occurs.

Figure 11:
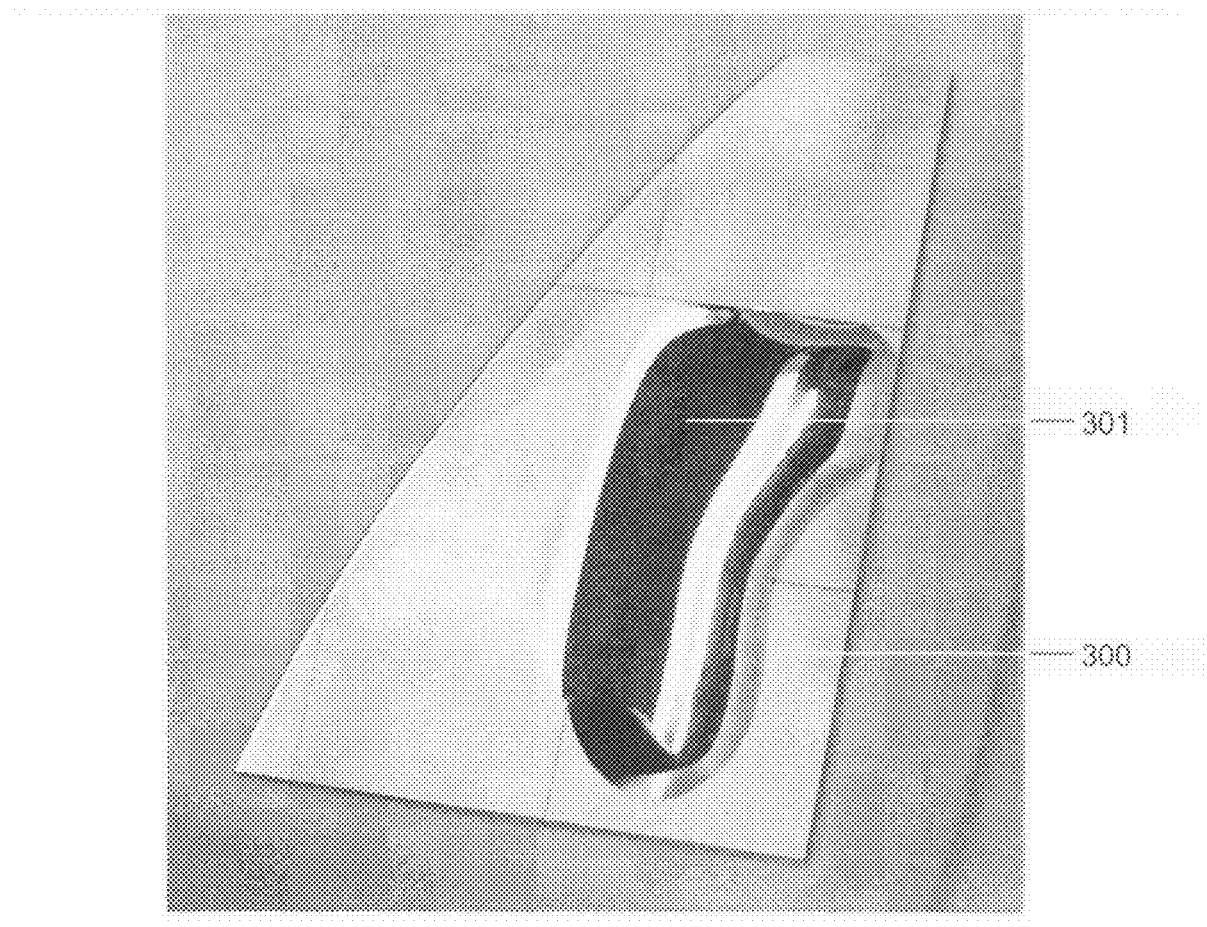
FIG. 11 depicts a view of a droplet on a platelet.
Figure 12:
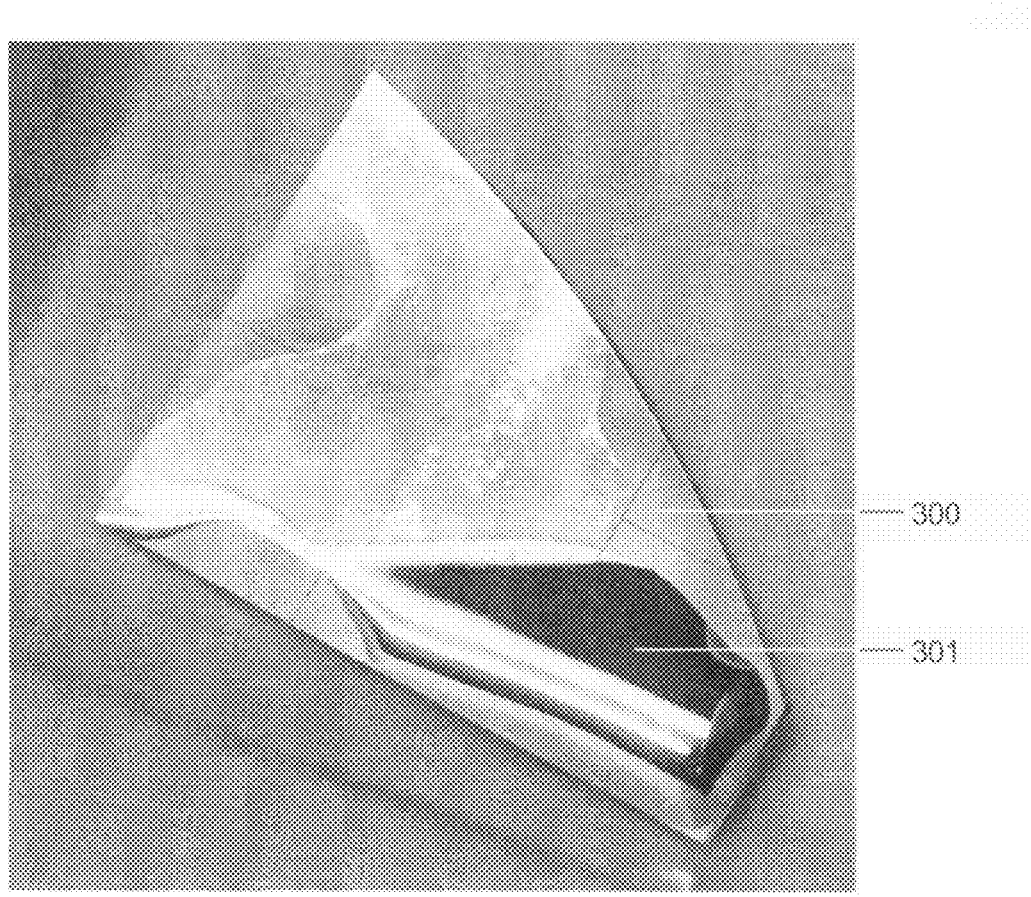
FIG. 12 depicts a view of a droplet on a platelet.

FIGS. 11 and 12 show different views of a Ga—In—Sn droplet 301 on a gold surface 302. As shown, the droplet 301 smears over the exterior surface 203, thereby providing excellent wetting properties.

Figure 13:
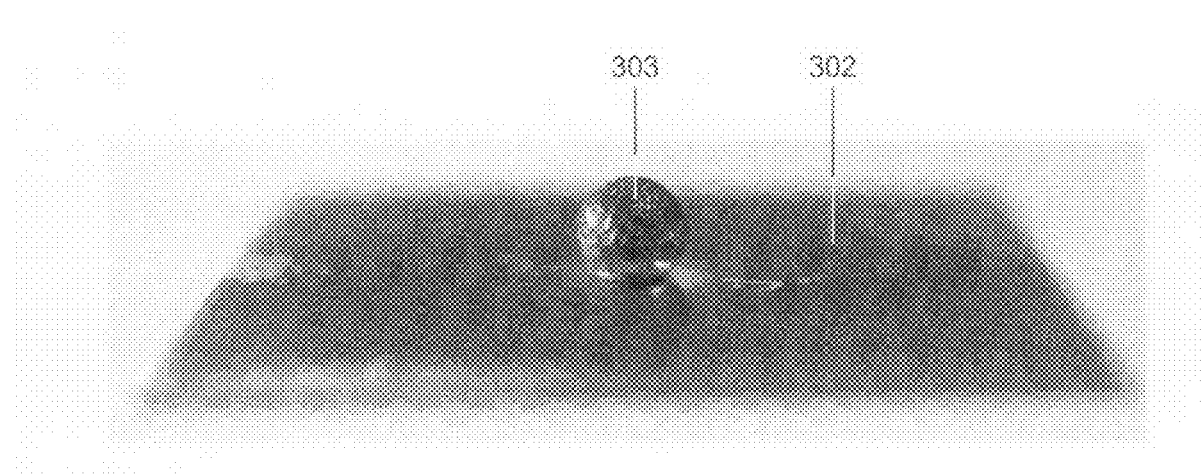
FIG. 13 depicts a view of a droplet on a platelet.
Figure 14:
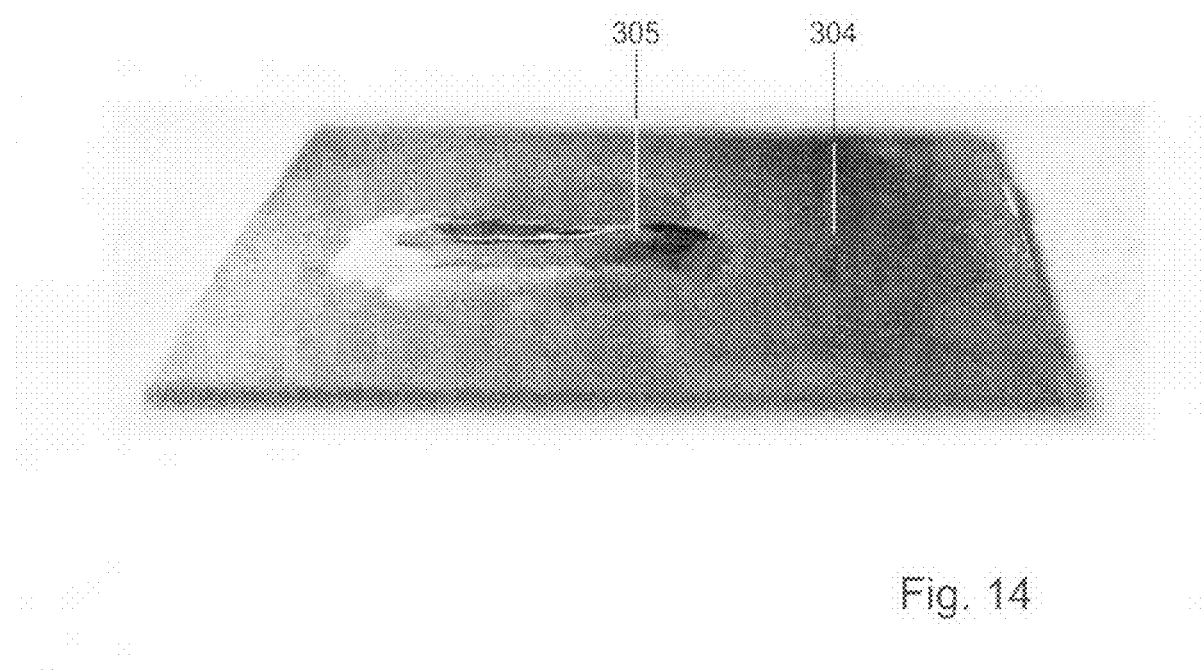
FIG. 14 depicts a view of a droplet on a platelet.

Further, FIGS. 13 and 14 shows a further experiment using a tin droplet 303. In FIG. 13, the droplet is positioned on a Mo platelet 302 that has been heated in a N2 atmosphere. As shown, poor wetting characteristics are obtained. However, FIG. 14 shows a similar tin droplet 305 that has been brought into contact with a Mo platelet 304 that has been pre-treated with hydrogen radicals according to an aspect of the invention. The droplet 305 now smears again over the surface 304 providing good wetting characteristics, thus improving radiation transmission features of the foil.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a radiation system constructed to provide a beam of radiation from radiation emitted by a radiation source, the radiation system comprising
      a contaminant trap configured to trap material emanating from the radiation source, the contaminant trap comprising a static part and a rotating part, the rotating part comprising a contaminant engaging surface arranged in the path of the radiation beam that receives the material emanating from the radiation source during propagation of the radiation beam in the radiation system, and
      a liquid tin cooling system constructed to cool the contaminant trap with liquid tin;
   an illumination system configured to condition the radiation beam;

a support constructed to support a patterning device, the patterning device being configured to impart the radiation beam with a pattern in its cross-section to form a patterned radiation beam;

a substrate table constructed to hold a substrate; and a projection system configured to project the patterned radiation beam onto a target portion of the substrate.

2. An apparatus according to claim 1, wherein the liquid tin cooling system is arranged to condition the temperature of the contaminant trap.

3. An apparatus according to claim 1, wherein the liquid tin cooling system comprises a closed liquid tin circuit arranged inside the static part of the contaminant trap.

4. An apparatus according to claim 3, wherein the liquid tin cooling system comprises a liquid tin supply channel inside the static part of the contaminant trap, the supply channel extending to the rotating part of the contaminant trap for supplying the liquid tin towards an external surface of the rotating part, the external surface comprising the contaminant engaging surface.

5. An apparatus according to claim 4, wherein the contaminant engaging surface is disposed on a foil, and wherein the liquid tin cooling system further comprises a return path along a leading edge of the foil comprised in the rotating part of the contaminant trap.

6. An apparatus according to claim 4, wherein the contaminant engaging surface is disposed on a foil, and wherein the liquid tin cooling system further comprises a return path embedded in the foil comprised in the rotating part of the contaminant trap.

7. An apparatus according to claim 1, wherein the liquid tin cooling system comprises a semi-open liquid tin circuit constructed to directly cool the rotating part of the contaminant trap.

8. An apparatus according to claim 1, wherein the liquid tin cooling system comprises an exterior supply channel having a spray end arranged to spray the rotating part of the contaminant trap.

9. An apparatus according to claim 8, wherein the contaminant engaging surface is disposed on a foil, and wherein the spray end is arranged near the foil comprised in the rotating part of the contaminant trap.

10. An apparatus according to claim 1, further comprising a gas inlet and a heating element, both arranged near the contaminant trap.

11. An apparatus according to claim 1, further comprising a radical or plasma generating unit.

12. An apparatus according to claim 1, wherein an exterior surface of the contaminant trap comprises a top layer having a low oxidation rate.

13. An apparatus according to claim 12, wherein the top layer comprises gold.

14. An apparatus according to claim 1, wherein the contaminant engaging surface is disposed on a foil, the foil having a segment that is substantially porous, and wherein a liquid tin supply channel ends in the porous segment of the foil.

15. A radiation system constructed to provide a beam of radiation from radiation emitted by a radiation source, the radiation system comprising:

a contaminant trap configured to trap material emanating from the radiation source, the contaminant trap comprising a static part and a rotating part, the rotating part comprising a contaminant engaging surface arranged in the path of the radiation beam that receives the material emanating from the radiation source during propagation of the radiation beam in the radiation system; and a liquid tin cooling system constructed to cool the contaminant trap with liquid tin.

16. A device manufacturing method comprising:

trapping material emanating from a radiation source using a contaminant trap comprising a static part and a rotating part, the rotating part comprising a contaminant engaging surface by arranging the surface in a radiation beam emitted by the radiation source;

cooling the contaminant trap with liquid tin;

conditioning the radiation beam;

imparting the radiation beam with a pattern in its cross-section using a patterning device to form a patterned radiation beam; and projecting the patterned radiation beam onto a target portion of a substrate.

17. A method according to claim 16, further comprising collecting liquid tin that is dropped into a chamber in which the contaminant trap is arranged, and reusing collected liquid tin to cool the contaminant trap.

18. A method according to claim 16, further comprising regenerating tin liquid in a cooling circuit of a liquid tin cooling system.

19. A method according to claim 16, further comprising pre-treating a contaminant trap exterior surface for improved surface wetting characteristics.

20. A method according to claim 19, wherein said pre-treating comprises heating the exterior surface.

21. A method according to claim 20, wherein said heating the exterior surface is performed in a hydrogen atmosphere.

22. A method according to claim 19, wherein said pre-treating comprises introducing radicals or a plasma near the contaminant trap.

23. A method according to claim 22, wherein said plasma is an oxygen plasma.

24. A method according to claim 19, wherein said pre-treating comprises coating the exterior surface with a top layer having a low oxidation rate.

25. A method according to claim 24, wherein said top layer comprises gold.

26. A method according to claim 24, wherein the top layer has a solubility in liquid tin of less than about 0.05%.

27. A method according to claim 26, wherein the top layer has a solubility in liquid tin of less than about 0.005%.

28. A radiation generating method comprising:

trapping material emanating from a radiation source using a contaminant trap comprising a static part and a rotating part, the rotating part comprising a contaminant engaging surface by arranging the surface in a radiation beam emitted by the radiation source; and cooling the contaminant trap with liquid tin.

* * * * *